US012727309B2

(12) United States Patent
Park et al.

(10) Patent No.: US 12,727,309 B2
(45) Date of Patent: Sep. 1, 2026

(54) LIGHT EMITTING DIODE ASSEMBLY

(71) Applicant: LG Display Co., Ltd., Seoul (KR)

(72) Inventors: Hyun Min Park, Paju-si (KR); Jae Ho Lee, Paju-si (KR); Jin Su Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 428 days.

(21) Appl. No.: 18/477,303

(22) Filed: Sep. 28, 2023

(65) Prior Publication Data

US 2024/0258488 A1 Aug. 1, 2024

(30) Foreign Application Priority Data

Feb. 1, 2023 (KR) ........................ 10-2023-0013434

(51) Int. Cl.

| | |
|---|---|
| ***H01L 33/62*** | (2010.01) |
| ***H01L 25/13*** | (2006.01) |
| ***H10H 20/857*** | (2025.01) |
| ***H10W 90/00*** | (2026.01) |

(52) U.S. Cl.

CPC .......... *H10H 20/857* (2025.01); *H10W 90/00* (2026.01)

(58) Field of Classification Search

CPC .... H10H 20/857; H10H 20/831; H10H 20/84; H10H 20/853; H10H 20/872; H10H 20/80; H01L 25/13; H01L 25/0753; H01L 25/075; H01L 23/60; H01L 23/62; H01L 23/53285; H10W 90/00; H10W 90/754; H10W 90/753; H10W 42/60; H10W 42/80

See application file for complete search history.

(56) References Cited

U.S. PATENT DOCUMENTS

| | | | | |
|---|---|---|---|---|
| 8,415,698 | B2 | 4/2013 | Hwang et al. | |
| 10,586,892 | B2 * | 3/2020 | Hong | H01L 25/167 |
| 2018/0309026 | A1 * | 10/2018 | Hong | H01L 25/167 |
| 2023/0411574 | A1 * | 12/2023 | Hu | H01L 21/6835 |

FOREIGN PATENT DOCUMENTS

| | | | |
|---|---|---|---|
| KR | 100986336 | B1 | 10/2010 |
| KR | 20120068788 | A | 6/2012 |
| KR | 20150010211 | A | 1/2015 |

* cited by examiner

*Primary Examiner* — Nikolay K Yushin

(74) *Attorney, Agent, or Firm* — Seed Intellectual Property Law Group LLP

(57) ABSTRACT

A light emitting diode assembly is disclosed. The light emitting diode assembly includes a first electrode and a second electrode spaced apart from each other on a substrate, a light emitting diode overlapping with the first electrode and the second electrode, a cap covering the light emitting diode, and a protective layer covering the first electrode and the second electrode and including an electrostatic guide hole exposing a portion of the first electrode.

18 Claims, 7 Drawing Sheets

LIGHT EMITTING DIODE ASSEMBLY

CROSS-REFERENCE TO RELATED APPLICATION(S)

This application claims the benefit of Korean Patent Application No. 10-2023-0013434, filed on Feb. 1, 2023, which is hereby incorporated by reference as if fully set forth herein.

BACKGROUND

Technical Field

The present disclosure relates to a light emitting diode assembly, and more particularly to a light emitting diode assembly capable of preventing a light emitting diode chip from being damaged due to electrostatic discharge (ESD) while maintaining a shape of a cap.

Description of the Related Art

A light emitting diode (LED) is a device configured to produce minority carriers (e.g., electrons or holes) injected using a p-n junction structure of a compound semiconductor, and then to emit certain light through recombination of the minority carriers. Such a light emitting diode may be used as a display device or a backlight.

BRIEF SUMMARY

The inventors have realized that the light emitting diode in the related art, however, may become unstable due to an abrupt voltage increase caused by electrostatic discharge (ESD). The technical problems of the light emitting diode in the related art is that the abrupt voltage increase caused by ESD reduces the lifespan of the light emitting diode.

One or more embodiments of the present disclosure is directed to a light emitting diode assembly that substantially obviates one or more problems due to limitations and disadvantages of the related art.

The present disclosure provides a light emitting diode assembly having an electrostatic guide hole capable of guiding a current path of electrostatic discharge.

The light emitting diode assembly of the present disclosure includes an electrostatic guide hole disposed at a protective layer between first and second electrodes and a light emitting diode chip, to expose the first electrode, thereby enabling current of electrostatic discharge to be guided toward the electrostatic guide hole. Accordingly, the light emitting diode assembly of the present disclosure may prevent damage to the light emitting diode chip caused by electrostatic discharge through guidance of an electrostatic discharge path toward the electrostatic guide hole.

In addition, in the light emitting diode assembly of the present disclosure, the electrostatic guide hole is formed along a peripheral line of a cap on the first electrode and, as such, a shape of the cap may be maintained.

Additional advantages, technical benefits, and features of the disclosure will be set forth in part in the description which follows and in part will become apparent to those having ordinary skill in the art upon examination of the following or may be learned from practice of the disclosure. The technical benefits and other benefits of the disclosure may be realized and attained by the structure particularly pointed out in the written description and claims hereof as well as the appended drawings.

In one embodiment, a light emitting diode assembly includes a first electrode and a second electrode spaced apart from each other on a substrate, a light emitting diode chip overlapping with the first electrode and the second electrode, a mold or cap covering the light emitting diode chip, and a protective layer covering the first electrode and the second electrode and including an electrostatic guide hole exposing a portion of the first electrode.

The light emitting diode assembly according to each embodiment of the present disclosure may have the following effects.

First, the light emitting diode assembly according to each embodiment of the present disclosure may include an electrostatic guide hole provided at a protective layer between first and second electrodes and a light emitting diode chip, to expose the first electrode, and, as such, may have an effect of preventing the light emitting diode chip from being damaged due to electrostatic discharge.

Second, the electrostatic guide hole may be formed along a peripheral line of a cap on the first electrode and, as such, the light emitting diode assembly according to each embodiment of the present disclosure may have an effect of maintaining a shape of the cap or protective layer.

Third, the light emitting diode assembly according to each embodiment of the present disclosure may have effects of reducing a process time and costs because elimination of electrostatic discharge is possible through provision of the electrostatic guide hole at the protective layer and, as such, a separate device configured to eliminate electrostatic discharge is not required.

Fourth, the light emitting diode assembly according to each embodiment of the present disclosure may reduce energy consumption and use of harmful substances because elimination of electrostatic discharge and maintenance of the cap shape may be achieved through provision of the electrostatic guide hole at the protective layer. In this regard, the light emitting diode assembly according to each embodiment of the present disclosure may have an environment/social/governance (ESG) effect by virtue of eco-friendly, low power consumption and process optimization advantages.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings.

DETAILED DESCRIPTION

Figure 1:
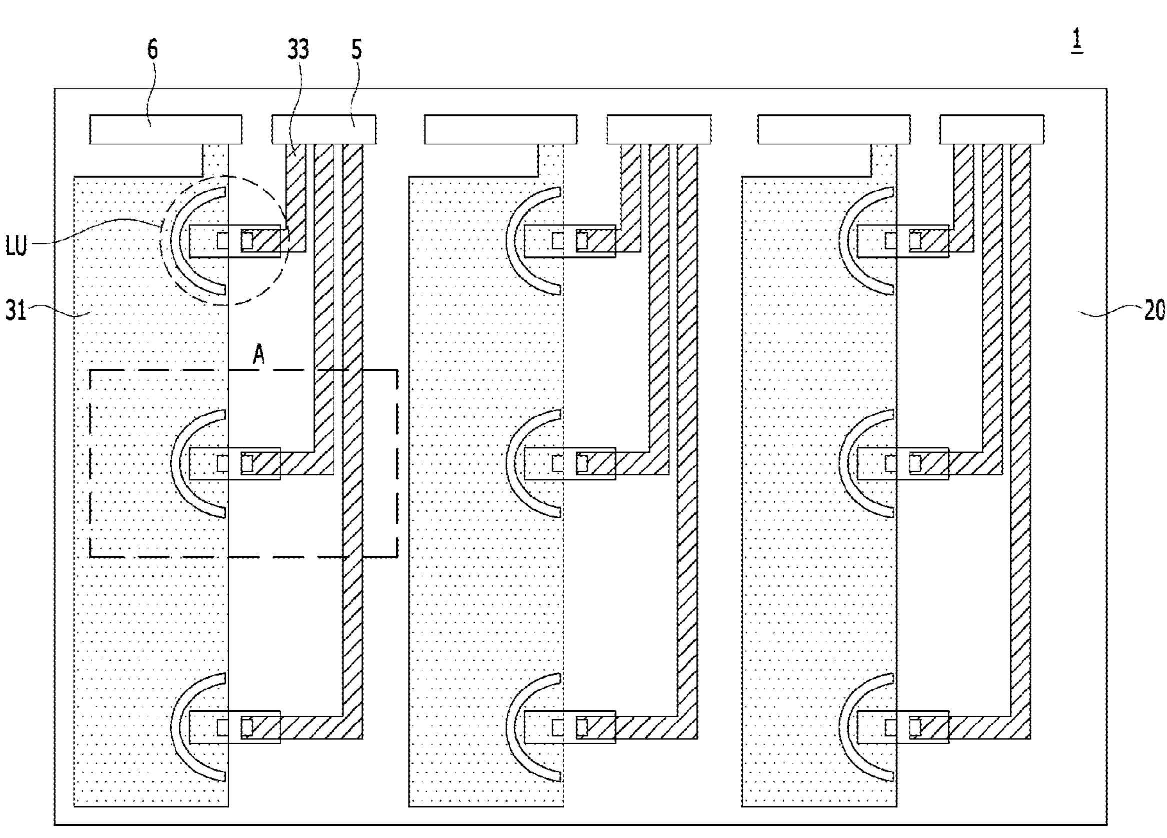
FIG. 1 is a schematic plan view of a light emitting diode assembly according to a first embodiment of the present disclosure.

Advantages and features of the present disclosure, and implementation methods thereof will be clarified through following embodiments described with reference to the accompanying drawings. The present disclosure may however, be embodied in different forms and should not be construed as limited to the embodiments set forth herein. Rather, these embodiments are provided so that this disclosure will be thorough and complete, and will fully convey the scope of the present disclosure to those skilled in the art.

The shapes, sizes, dimensions (e.g., length, width, height, thickness, radius, diameter, area, etc.), ratios, angles, number of elements, and the like disclosed in the drawings for describing various embodiments of the present disclosure are merely examples, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals refer to like elements throughout. In the following description, when the detailed description of the relevant known function or configuration is determined to unnecessarily obscure aspects of the present disclosure, the detailed description will be omitted.

When "comprise," "have," and "include" described in the present disclosure are used, another part may be added unless "only" is used. Terms in a singular form may include plural forms unless stated to the contrary.

In construing an element, the element is construed as including an error or tolerance range although there is no explicit description of such an error or tolerance range.

In describing a positional relationship, for example, when a positional relation between two parts is described as, for example, "on," "over," "under," and "next," one or more other parts may be disposed between the two parts unless a more limiting term, such as "just" or "direct(ly)" is used.

In describing a temporal relationship, for example, when the temporal order is described as, for example, "after," "subsequent," "next," and "before," a situation that is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another, and may not define order. For example, a first element could be termed a second element within the scope of the present disclosure.

In the following description of the embodiments, "first horizontal axis direction," "second horizontal axis direction" and "vertical axis direction" should not be interpreted as having only geometrical relations in which parts are perpendicular to each other, and may mean wider orientations within the ranges in which elements of the disclosure functionally work.

The term "at least one" should be understood as including all combinations presented by one or more of associated elements. For example, "at least one of a first element, a second element or a third element" may not only mean the first element, the second element or the third element, respectively, but also mean all combinations presented by two or more of the first element, the second element and the third element.

Features of various embodiments of the present disclosure may be partially or wholly coupled to or combined with each other, and may be variously inter-operated with each other and driven technically as those skilled in the art can sufficiently understand. The embodiments of the present disclosure may be carried out independently from each other, or may be carried out together in a co-dependent manner.

In the drawings, wherever possible, the same elements will be denoted by the same reference numerals throughout the drawings even though they are depicted in different drawings. Further, the elements illustrated in the accompanying drawings may have scales different from the actual scales thereof for convenience of explanation, and are thus limited by the scales illustrated in the drawings.

Hereinafter, exemplary embodiments of the present disclosure will be described with reference to the accompanying drawings.

Figure 2:
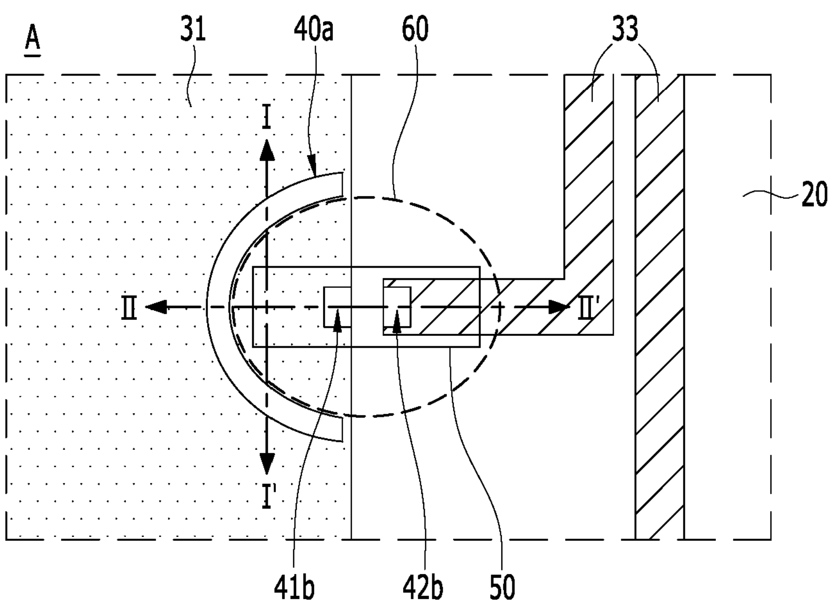
FIG. 2 is an enlarged view of an area A in FIG. 1.
Figure 3:
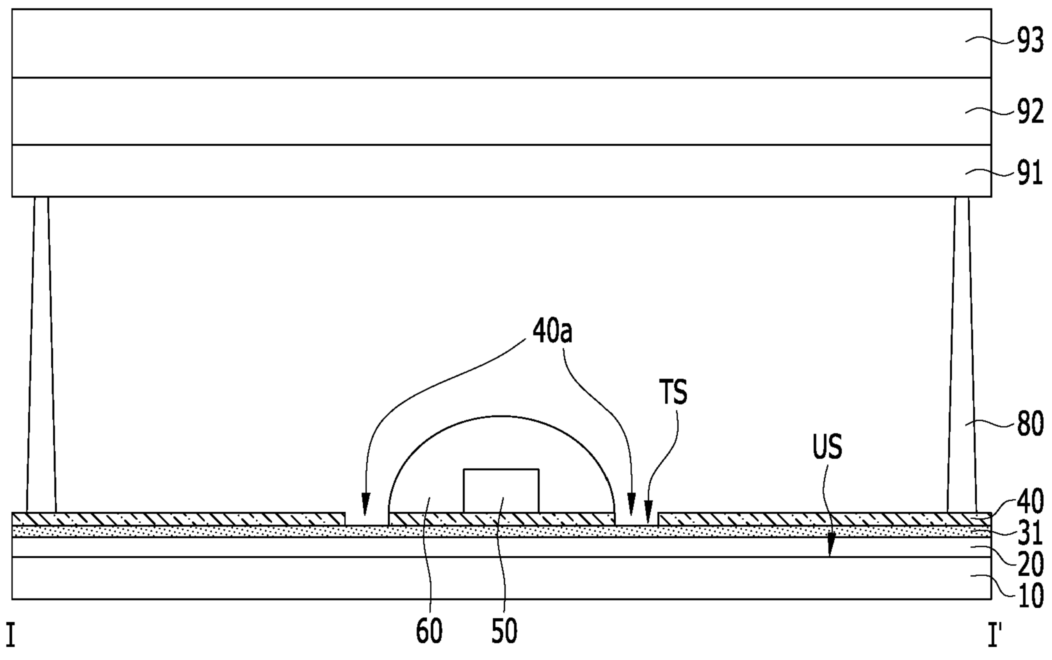
FIG. 3 is a cross-sectional view taken along line I-I' in FIG. 2.
Figure 4:
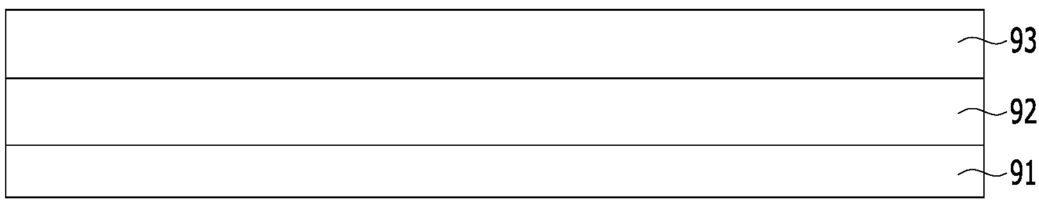
FIG. 4 is a cross-sectional view taken along line II-II' in FIG. 2.
Figure 4:
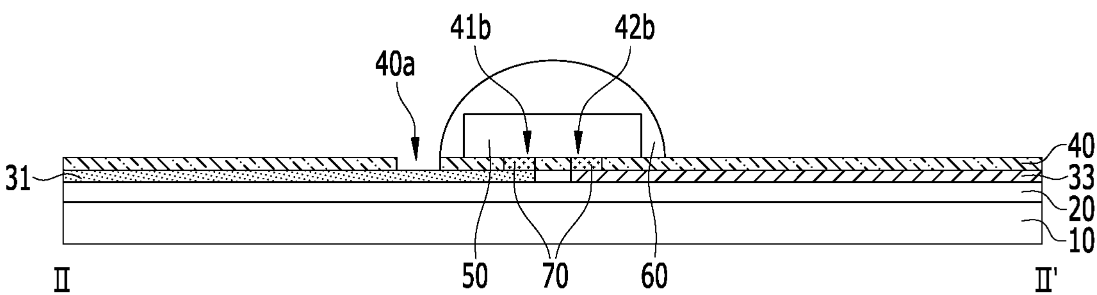

FIG. 1 is a schematic plan view of a light emitting diode assembly according to a first embodiment of the present disclosure. FIG. 2 is an enlarged view of an area A in FIG. 1. FIGS. 3 and 4 are cross-sectional views taken along line I-I' and line II-II' in FIG. 2, respectively.

Referring to FIGS. 1 to 4, the light emitting diode assembly according to the first embodiment, which is designated by reference numeral "1", may include a first electrode 31 and a second electrode 33 spaced apart from each other on a substrate 20, a light emitting diode chip 50 overlapping with the first electrode 31 and the second electrode 33, a mold 60 covering the light emitting diode chip 50, and a protective layer 40 covering the first electrode 31 and the second electrode 33 while including an electrostatic guide hole 40*a* exposing a portion of the first electrode 31. In particular, the electrostatic guide hole 40*a* extends through the protective layer 40. By extending through the protective layer 40, the electrostatic guide hole 40*a* exposes a top surface TS of the first electrode 31.

The term "diode chip" is used herein in the broadest sense to include any substrate that contains an integrated circuit diode. This can be a single substrate with many diodes thereon or one substrate with one diode. The substrate can be of any material, whether silicon, glass, quartz, PCB and while it could be a semiconductor, it does not, itself need to be a semiconductor.

The term "mold," one example of which is mold 60, is used in herein the broadest sense to include material that was formed by use of a mold or in a mold, sometimes called a molded material or was formed into a solid shape but not in a physical mold, such as by liquid being dropped onto the diode and then hardening into a solid material in particular shape due to surface tension, internal viscosity or other method. Thus, the term mold 60, molded material 60, cap 60 all have the same meaning herein. The mold 60 can also be made into a capping material by dropping a polymer on the diode in a liquid form that later hardens, such as by curing or exposure to UV light or air drying and it is not necessary that cap 60, namely mold 60, be formed inside a mold. The mold 60, namely cap 60 is made on a material that keeps out impurities, moisture and acts to protect the semiconductor diode from contamination.

The substrate 20 may be disposed at an upper surface US of a lower cover 10. In addition, the first electrode 31 and the second electrode 33 may be formed on the substrate 20. A first pad 6 and a second pad 5 may be provided at one side of the substrate 20.

Each of the first electrode 31 and the second electrode 33 may be provided in plural on the substrate 20. The first electrode 31 and the second electrode 33 may be connected to different pads, that is, the first pad 6 and the second pad 5, respectively, and, as such, may receive different signals from the first pad 6 and the second pad 5, respectively. In the light emitting diode assembly 1 of this embodiment, the first electrode 31 may receive a positive electrode or anode signal from the first pad 6, and the second electrode 33 may receive a negative electrode or cathode signal. In addition, one first electrode 31 may be connected to one first pad 6, and a plurality of the second electrode 33 may be connected to one second pad 5.

In other words, in the light emitting diode assembly 1 of this embodiment, the plurality of second electrodes 33 may correspond to one first electrode 31, and light emitting diode units LU may be formed in areas where the second electrodes 33 are provided, respectively. That is, a plurality of light emitting diode units LU may be provided on one first electrode 31. In this case, accordingly, the area ratio between the first electrode 31 and the second electrode 33 connected to one light emitting diode unit LU may be determined such that the area of the first electrode 31 is greater than the area of the second electrode 33, as shown in FIG. 1. Accordingly, the area ratio between an area of the first electrode 31 and an area of the second electrode 33 may be greater than 1.

The light emitting diode units LU may include, on one first electrode 31, a plurality of light emitting diode chips 50 connected to the first electrode 31, respectively. In addition, each light emitting diode unit LU may include an electrostatic guide hole 40*a* at one side of the light emitting diode chip 50 corresponding thereto, and may include a first connecting hole 41*b* and a second connecting hole 42*b* respectively disposed in regions overlapping with the light emitting diode chip 50 and connected to the first electrode 31 and a corresponding one of the second electrodes 33. Here, the electrostatic guide hole 40*a* and the first and second connecting holes 41*b* and 42*b* may be regions where the protective layer 40 is partially removed, as shown in FIGS. 3 and 4.

The protective layer 40 on a plurality of first electrodes 31 and a plurality of second electrodes 33 may wholly (or entirely) cover the substrate 20, and may be disposed between the plural first and second electrodes 31 and 33 and the light emitting diode chips 50. The protective layer 40 may protect the plurality of first electrodes 31 and the plurality of second electrodes 33. In some cases, the protective layer 40 is made of a white photo solder resist (PSR) ink and, as such, may reflect light advancing toward the substrate 20 after being emitted from the light emitting diode chip 50 disposed thereon, thereby preventing the light emitted from the light emitting diode chip 50 from disappearing. In addition, the protective layer 40 of the light emitting diode assembly 1 according to the embodiment of the present disclosure may include the electrostatic guide hole 40*a*, the first connecting hole 41*b*, and the second connecting hole 42*b* formed through removal of portions of the protective layer 40. Accordingly, the protective layer 40 on the plurality of first electrodes 31 and the plurality of second electrodes 33 may cover the entire surface of the substrate 20 except for where the holes (e.g., the electrostatic guide hole 40*a*, the first connecting hole 41*b*, and the second connecting hole 42*b*) are located.

The first connecting hole 41*b* and the second connecting hole 42*b* may be regions from which the protective layer 40 is removed, in order to interconnect the light emitting diode chip 50 and the first and second electrodes 31 and 33, respectively. Accordingly, solders 70 may be provided at the first connecting hole 41*b* and the second connecting hole 42*b* in order to interconnect the light emitting diode chip 50 and the first and second electrodes 31 and 33, respectively. That is, as shown in FIG. 4, the solders 70 may fill the first connecting hole 41*b* and the second connecting hole 42*b* in order to electrically connect the first electrode 31 to the light emitting diode chip 50 and electrically connect the second electrode 33 to the light emitting diode chip 50.

The electrostatic guide hole 40*a* may be a region from which the protective layer 40 on the first electrode 31 is removed, corresponding to each of the plurality of light emitting diode chips 50. The electrostatic guide hole 40*a* may have a shape formed along a peripheral line of the mold 60 provided in a region where the first electrode 31 is disposed. That is, the electrostatic guide hole 40*a* may define the peripheral line of the mold 60 formed at the side of at least the first electrode 31. For example, when the mold 60 has a circular shape in plan view, and a center thereof overlaps with the first electrode 31, the electrostatic guide hole 40*a* may have an arc shape (or C-shape) along the peripheral line of the mold 60 on the first electrode 31.

Since the electrostatic guide hole 40*a* exposes a portion of the first electrode 31, the electrostatic guide hole 40*a* may guide, toward the first electrode 31, an electrostatic discharge (ESD) path of frictional electricity or static electricity generated on the light emitting diode assembly 1. Generally, the electrostatic discharge path in the light emitting diode assembly 1 having the above-described area ratio between the first electrode 31 and the second electrode 33 in the embodiment of the present disclosure may cope with the following case.

When electrostatic discharge is generated on the protective layer 40, current of the electrostatic discharge may reach the first electrode 31 or the second electrode 33 after penetrating the protective layer 40 which has a relatively low resistance. When the current of the electrostatic discharge reaches the first electrode 31, which is a positive electrode, the current spreads over a wide area of the first electrode 31, and a small amount of residual current applies a forward voltage to the light emitting diode chip 50. As a result, there is no damage to the light emitting diode chip 50. However, when the current of the electrostatic discharge reaches the second electrode 33, which is a negative electrode, the area that the current may spread over the second electrode 33 is small because the area of the second electrode 33 is small (relatively compared to the area of the first electrode 31). As a result, a great amount of residual current may apply inverse voltage to the light emitting diode chip 50, thereby generating damage to the light emitting diode chip 50. On the other hand, when electrostatic discharge is generated at the mold 60 on the light emitting diode chip 50, current of the electrostatic discharge may reach to the first electrode 31 or the second electrode 33. When the current reaches the second electrode 33, damage to the light emitting diode chip 50 may be generated.

Accordingly, in some embodiments, the light emitting diode assembly 1 according to the embodiment of the present disclosure includes the electrostatic guide hole 40*a* formed through removal of a portion of the protective layer 40 on the first electrode 31 and, as such, it may be possible to guide current of electrostatic discharge generated on the protective layer 40 or the mold 60 to the electrostatic guide hole 40*a*. In detail, the first electrode 31 is intentionally exposed and, as such, it may be possible to guide static electricity generated on the light emitting diode assembly 1 toward the first electrode 31 exposed by the electrostatic guide hole 40*a*. Thus, the light emitting diode assembly 1 according to the embodiment of the present disclosure may prevent light loss and damage to the light emitting diode chip 50 caused by electrostatic discharge in accordance with provision of the electrostatic guide hole 40*a*.

In addition, the light emitting diode assembly 1 according to the embodiment of the present disclosure may not require a separate device for eliminating electrostatic discharge because elimination of electrostatic discharge may be achieved only through removal of a portion of the protective layer 40 included as a basic configuration (formation of the electrostatic guide hole).

The electrostatic guide hole 40*a* as described above may be provided at both sides of the mold 60 when viewed in a cross-sectional view taken along an area where the first electrode 31 is provided, as shown in FIG. 3. On the other hand, as shown in FIG. 4, the electrostatic guide hole 40*a* may be provided on the first electrode 31 at one side of the mold 60 when viewed in a cross-sectional view taken along an area where both the first electrode 31 and the second electrode 33 are provided. In other words, the electrostatic guide hole 40*a* may be provided not to overlap with the second electrode 33. However, the electrostatic guide hole 40*a* according to the embodiment of the present disclosure is not limited to the structures shown in the drawings, and may be formed to have a size smaller or greater than the size shown in the drawings, so long as the electrostatic guide hole 40*a* does not overlap with the second electrode 33 and the mold 60.

The plurality of light emitting diode chips 50 may be connected to one first electrode 31, and may be connected to corresponding ones of the plurality of second electrodes 33, respectively. As shown in FIG. 4, each light emitting diode chip 50 may be connected to the first electrode 31 and the corresponding second electrode 33 via solders 70 of a metal pattern having excellent electrical conductivity, which are disposed at the first connecting hole 41*b* and the second connecting hole 42*b*, respectively. Accordingly, when the light emitting diode chip 50 receives, via the solders 70, electrical signals supplied from the first pad 6 and the second pad 5 to the first electrode 31 and the second electrode 33, the light emitting diode chip 50 may emit light.

The mold 60 may be provided on the light emitting diode chip 50. In detail, the mold 60 may be provided on the protective layer 40 while having a greater area than that of the light emitting diode chip 50, to completely cover the light emitting diode chip 50. The mold 60 as described above may protect the light emitting diode chip 50 while covering the light emitting diode chip 50. In addition, the mold 60 may have a curved surface and, as such, and may achieve an enhancement in light extraction efficiency of light emitted from the light emitting diode chip 50.

For example, the mold 60 may be formed of a liquid-phase resin including a phosphor. The mold 60 as described above may spread over an area slightly greater than a predetermined area without being coated over only the predetermined area in a formation procedure thereof due to characteristics of the liquid phase thereof. Furthermore, when the content of the phosphor in the liquid-phase resin increases, it may be more difficult to coat the mold 60 over the predetermined area due to an increase in viscosity of the liquid-phase resin. Such a problem of spreading of the liquid-phase resin including the phosphor may cause change of the shape of the mold and, as such, there may be a problem in that light-directing characteristics of the light emitting diode chip may be varied.

Accordingly, in some embodiments, the light emitting diode assembly 1 according to the embodiment of the present disclosure includes the electrostatic guide hole 40*a* formed through removal of the protective layer 40 along the peripheral line of the mold 60 and, as such, the mold 60 may be provided up to a boundary line of the electrostatic guide hole 40*a* on the protective layer 40 in accordance with surface tension. Accordingly, the mold 60 may be controlled in an area by the electrostatic guide hole 40*a* and, as such, may maintain a desired shape thereof. In other words, the electrostatic guide hole 40*a* may define the peripheral line of the mold 60.

In addition, since the mold 60 includes a phosphor material, white light may be discharged from the mold 60 as light emitted from the light emitting diode chip 50 passes through the mold 60. The white light discharged from the light emitting diode assembly 1, as described above, may function as backlight in a display device, and may then be transmitted to a display panel 93 after passing through a diffusion sheet 91 and an optical sheet 92, as shown in FIGS. 3 and 4.

The diffusion sheet 91 spaced apart from the light emitting diode assembly 1 by a predetermined distance may adjust a direction of light discharged from the light emitting diode assembly 1 such that the light uniformly advances toward the optical sheet 92.

The optical sheet 92 on the diffusion sheet 91 may be provided in plural. As the optical sheet 92 is provided in plural, it may be possible to concentrate light passing through the diffusion sheet 91 toward the display panel 93, and as such, an increase in luminance may be maximized.

The display panel 93 on the optical sheet 92 may include a TFT array substrate, a color filter substrate, etc. At the display panel 93 as described above, a plurality of pixels may be arranged and, as such, an image may be output from the display panel 93. Accordingly, the display device in the embodiment of the present disclosure may display an image by transmitting or blocking light supplied from the light emitting diode assembly 1 at the display panel 93 on a pixel basis. In one embodiment, the display device includes the light emitting diode assembly. In another embodiment, the display device may be considered identical as the light emitting diode assembly.

Here, the diffusion sheet 91, the optical sheet 92, and the display panel 93 in the embodiment of the present disclosure are only illustrative, and display devices, to which the light emitting diode assembly 1 is applicable, are not limited to the above-described display device.

In addition, referring to FIG. 3, the display device in the embodiment of the present disclosure may further include a support 80 between the light emitting diode assembly 1 and the diffusion sheet 91. The support 80 may be disposed on the light emitting diode assembly 1 in an area where each light emitting diode unit LU is not provided. The support 80 as described above maintains a selected (or predetermined) distance between the light emitting diode assembly 1 and the diffusion sheet 91, and may prevent configurations of the diffusion sheet 91 and the optical sheet 92 on the diffusion sheet 91 from being bent.

Figure 5:
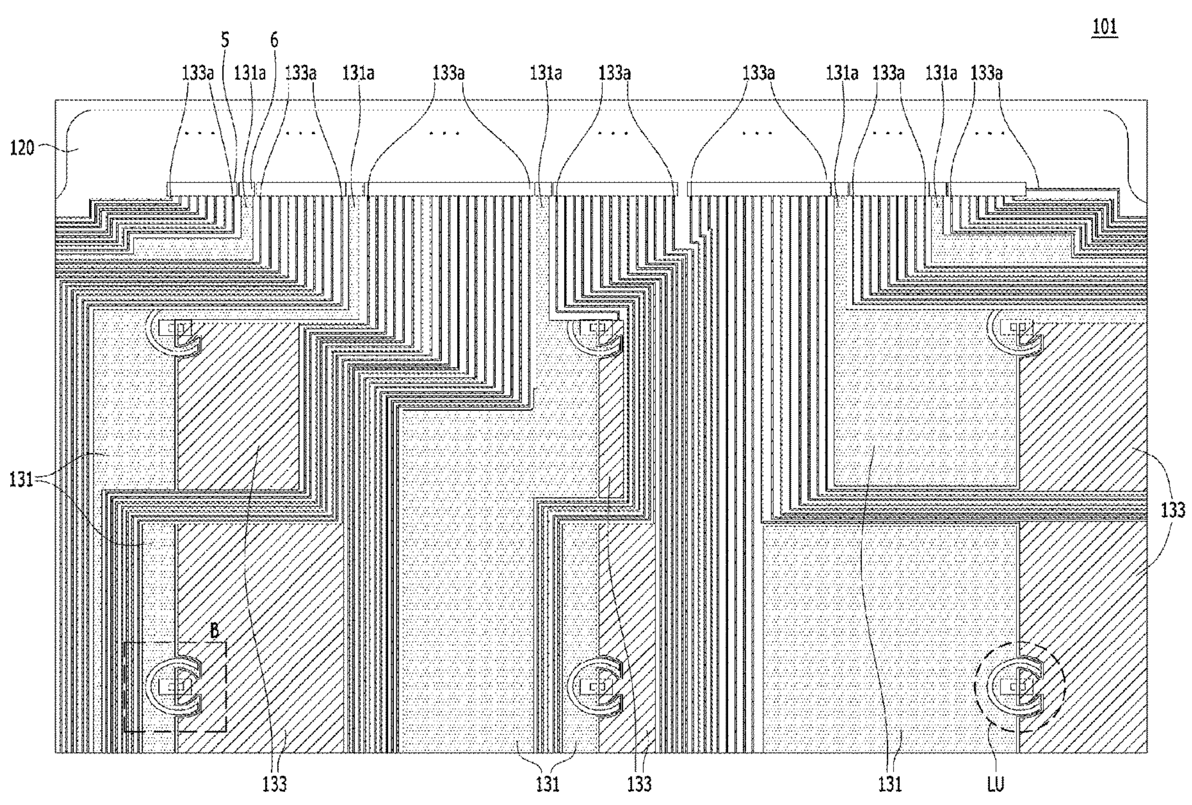
FIG. 5 is a plan view of a light emitting diode assembly according to a second embodiment of the present disclosure.
Figure 6:
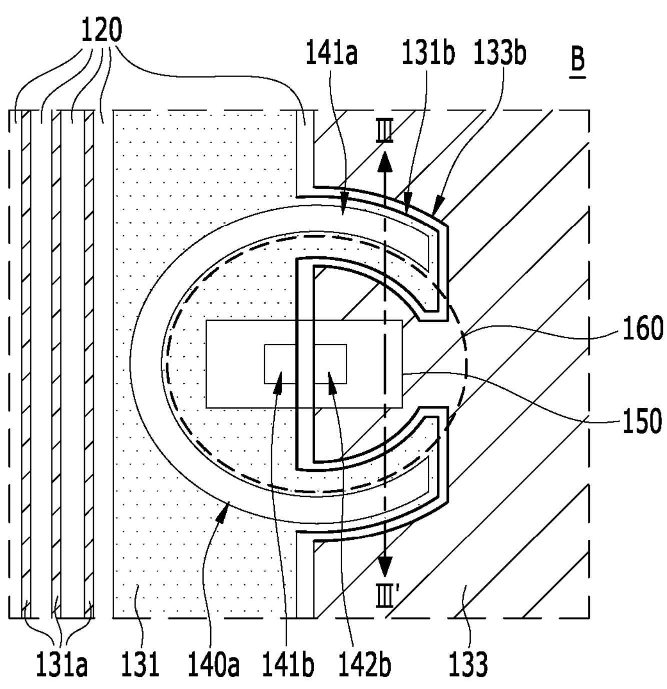
FIG. 6 is an enlarged view of an area B in FIG. 5.
Figure 7:
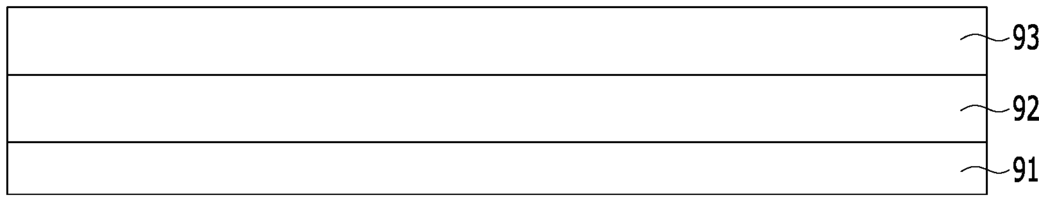
FIG. 7 is a cross-sectional view taken along line III-III' in FIG. 6.
Figure 7:
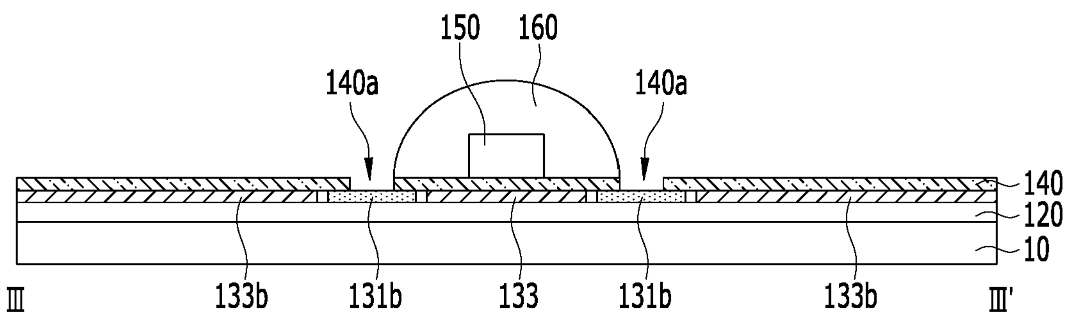

FIGS. 5 and 6 are plan views of a light emitting diode assembly 101 according to a second embodiment of the present disclosure. FIG. 7 is a cross-sectional view taken along line III-III' in FIG. 6. In the second embodiment, description of configurations thereof identical to those of the previous embodiment will be omitted.

Referring to FIGS. 5 and 6, the light emitting diode assembly 101 according to the second embodiment may include a plurality of light emitting diode chips 150 on a substrate 120. Each of the plurality of light emitting diode chips 150 may overlap with a first electrode 131/131*a*/131*b* and a second electrode 133/133*a*/133*b* spaced apart from each other. In detail, each of the plurality of light emitting diode chips 150 may overlap with a first electrode pattern 131 and a second electrode pattern 133 spaced apart from each other.

The first electrode 131/131*a*/131*b* may include a plurality of first electrode patterns 131 separated from one another, corresponding to the plurality of light emitting diode chips 150, respectively, and the second electrode 133/133*a*/133*b* may include a plurality of second electrode patterns 133 separated from one another, corresponding to the plurality of light emitting diode chips 150, respectively. In this case, a total area ratio of the plurality of first electrode patterns 131 may be greater than a total area ratio of the plurality of second electrode patterns 133. Accordingly, the total area ratio between a collective area of the first electrode patterns 131 and a collective area of the plurality of second electrode patterns 133 may be greater than 1.

The first electrode patterns 131, which are provided in at least one direction, may be electrically interconnected through a connecting pattern. In addition, at least one of the first electrode patterns 131 and the connecting pattern interconnected in one direction may receive a signal from a first pad 6 provided at an outside portion of the substrate 120 via a first connecting line 131*a*.

In accordance with the second embodiment, each first electrode pattern 131 may include a protrusion 131*b* protruding toward the second electrode pattern 133. The protrusion 131*b* of the first electrode pattern 131 may have a shape in which the protrusion 131*b* protrudes along a peripheral line of the mold 160 from two points overlapping with the peripheral line of the mold 160 at one flat side surface of the first electrode pattern 131. In this case, a light emitting diode chip 150 may be provided between two portions of the protrusion 131*b* protruding from the two points of the one flat side surface of the first electrode pattern 131. Accordingly, it is beneficial that the two portions of the protrusion 131*b* protruding from the two points not meet, in order to enable the first electrode pattern 131 and the second electrode pattern 133 provided on the same layer to be connected to the light emitting diode chip 150.

Meanwhile, the second electrode patterns 133 may be connected to a plurality of light emitting diode chips 150, respectively, and, as such, may receive a signal from a second pad 5 disposed at the outside portion of the substrate 120 via a plurality of second connecting lines 133*a*, respectively. In addition, in accordance with the second embodiment, each second electrode pattern 133 may include a groove 133*b* recessed toward an inside of the second electrode pattern 133 along the shape of the protrusion 131*b* of the corresponding first electrode pattern 131. That is, the protrusion 131*b* of the first electrode pattern 131 and the groove 133*b* of the second electrode pattern 133 may be provided to have shapes engaging with each other while being spaced apart from each other.

Referring to FIGS. 5 to 7, a protective layer 140 on the first electrode 131/131*a*/131*b* and the second electrode 133/133*a*/133*b* may have opened areas, that is, an electrostatic guide hole 140*a*, a first connecting hole 141*b*, and a second connecting hole 142*b*, for each light emitting diode unit LU.

The first connecting hole 141*b* and the second connecting hole 142*b* may be areas where configurations interconnecting corresponding ones of the first electrode pattern 131 and the second electrode pattern 133 and the light emitting diode chip 150 are provided, respectively.

The electrostatic guide hole 140*a*, which exposes the first electrode pattern 131, may also be provided on the protrusion 131*b* because the first electrode pattern 131 includes the protrusion 131*b* extending along the peripheral line of the mold 150. In this regard, the electrostatic guide hole 140*a* according to the second embodiment may expose a greater portion of the first electrode 131/131*a*/131*b* than that of the first embodiment. Accordingly, when electrostatic discharge is generated on the light emitting diode chip 150, it may be possible to guide an electrostatic discharge path toward the electrostatic guide hole 140*a* at an increased probability.

In addition, since the electrostatic guide hole 140*a* is provided along the peripheral line of the mold 150, control of the peripheral line of the mold 150 may be enhanced, as compared to the first embodiment. That is, the electrostatic guide hole 140*a* may more stably maintain the shape of the mold 150, as compared to the first embodiment.

As apparent from the above description, the light emitting diode assembly according to each embodiment of the present disclosure may have the following effects.

The light emitting diode assembly according to each embodiment of the present disclosure may include an electrostatic guide hole is provided at a protective layer between first and second electrodes and a light emitting diode chip, to expose the first electrode, and, as such, may have an effect of preventing the light emitting diode chip from being damaged due to electrostatic discharge. At the same time, the electrostatic guide hole may be formed along a peripheral line of a mold on the first electrode and, as such, there is an effect of maintaining a shape of the mold. That is, the light emitting diode assembly according to each embodiment of the present disclosure may have both effects of elimination of electrostatic discharge and maintenance of the mold shape only through provision of the electrostatic guide hole at the protective layer.

In addition, the light emitting diode assembly according to each embodiment of the present disclosure may have effects of reducing a process time and costs because elimination of electrostatic discharge is possible through provision of the electrostatic guide hole at the protective layer and, as such, a separate device configured to eliminate electrostatic discharge is not required.

The light emitting diode assembly according to one embodiment of the present disclosure is described as follows.

The light emitting diode assembly according to one embodiment of the present disclosure may include a first electrode and a second electrode spaced apart from each other on a substrate, a light emitting diode chip overlapping with the first electrode and the second electrode, a mold covering the light emitting diode chip, and a protective layer covering the first electrode and the second electrode and including an electrostatic guide hole exposing a portion of the first electrode.

In the light emitting diode assembly according to one embodiment of the present disclosure, the electrostatic guide hole has a shape formed through removal of a portion of the protective layer along a peripheral line of the mold on the first electrode.

In the light emitting diode assembly according to one embodiment of the present disclosure, the first electrode comprises a protrusion protruding toward the second electrode while overlapping with the mold.

In the light emitting diode assembly according to one embodiment of the present disclosure, the second electrode comprises a groove spaced apart from the protrusion of the first electrode along a shape of the protrusion.

In the light emitting diode assembly according to one embodiment of the present disclosure, the electrostatic guide hole further exposes the protrusion of the first electrode along a peripheral line of the mold.

In the light emitting diode assembly according to one embodiment of the present disclosure, the light emitting diode chip is on the first electrode and the second electrode, the mold is on the light emitting diode chip, and the protective layer is between the first and second electrodes and the light emitting diode chip.

Although the foregoing description has been given mainly in conjunction with embodiments, these embodiments are only illustrative without limiting the disclosure. Those skilled in the art to which the present disclosure pertains can appreciate that various modifications and applications illustrated in the foregoing description may be possible without changing essential characteristics of the embodiments. Therefore, the above-described embodiments should be understood as exemplary rather than limiting in all aspects. In addition, the scope of the present disclosure should also be interpreted by the claims below rather than the above detailed description. All modifications or alterations as would be derived from the equivalent concept intended to be included within the scope of the present disclosure should also be interpreted as falling within the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light emitting diode assembly, comprising:

a first electrode and a second electrode spaced apart from each other on a substrate;

a light emitting diode overlapping with the first electrode and the second electrode;

a cap covering the light emitting diode;

a protective layer covering the first electrode and the second electrode; and an electrostatic guide hole in the protective layer, the electrostatic guide hole exposing a portion of the first electrode, wherein:

the first electrode includes a plurality of first electrode patterns separated from one another and a connecting pattern interconnecting the plurality of first electrode patterns; and the second electrode includes a plurality of second electrode patterns separated from one another.

2. The light emitting diode assembly according to claim 1, wherein the electrostatic guide hole has a shape formed through removal of a portion of the protective layer along a peripheral line of the cap on the first electrode.

3. The light emitting diode assembly according to claim 1, wherein:

the light emitting diode is on the first electrode and the second electrode;

the cap is on the light emitting diode; and the protective layer is between the first and second electrodes and the light emitting diode.

4. The light emitting diode assembly according to claim 1, wherein the first electrode comprises a protrusion protruding toward the second electrode while overlapping with the cap.

5. The light emitting diode assembly according to claim 4, wherein the second electrode comprises a groove spaced apart from the protrusion of the first electrode along a shape of the protrusion.

6. The light emitting diode assembly according to claim 4, wherein the electrostatic guide hole further exposes the protrusion of the first electrode along a peripheral line of the cap.

7. A display device, comprising:

a plurality of light emitting diode on a substrate;

a first electrode and a second electrode spaced apart from each other while overlapping with each of the plurality of light emitting diode;

a cap covering each of the plurality of light emitting diode;

a protective layer covering the first electrode and the second electrode; and an electrostatic guide hole at the protective layer, the electrostatic guide hole exposing a portion of the first electrode, wherein:

the first electrode includes a plurality of first electrode patterns separated from one another, corresponding to the plurality of light emitting diode, respectively, and a connecting pattern to interconnect the plurality of first electrode patterns; and the second electrode includes a plurality of second electrode patterns separated from one another, corresponding to the plurality of light emitting diode, respectively.

8. The display device according to claim 7, comprising:

a first pad at an outside portion of the substrate; and a second pad at the outside portion of the substrate, wherein at least one of the plurality of the first electrode patterns and the connecting pattern receives a signal from the first pad, and wherein each of the plurality of second electrode patterns receives a signal from the second pad.

9. The display device according to claim 7, wherein, on the substrate, a total area ratio of the plurality of first electrode patterns is greater than a total area ratio of the plurality of second electrode patterns.

10. A display device, comprising:

a light emitting diode on a substrate;

a first electrode and a second electrode spaced apart from each other on the substrate;

a protective layer on the first electrode and the second electrode;

an electrostatic guide hole adjacent to the light emitting diode, the electrostatic guide hole extending through the protective layer;

a first connecting hole extending through the protective layer; and a second connecting hole adjacent to the first connecting hole, the second connecting hole extending through the protective layer, wherein the light emitting diode is on the protective layer and overlaps with the first electrode and the second electrode, wherein the first connecting hole overlaps with the first electrode, and wherein the second connecting hole overlaps with the second electrode.

11. The display device of claim 10, wherein the electrostatic guide hole exposes a top surface of the first electrode.

12. The display device of claim 10, comprising:

solders in a space defined by the first connecting hole and a space defined by the second connecting hole, wherein the solders, in operation, electrically connects the light emitting diode with the first electrode and electrically connects the light emitting diode with the second electrode.

13. The display device of claim 10, wherein the first electrode electrically connected to the light emitting diode has a first area and the second electrode electrically connected to the light emitting diode has a second area, wherein an area ratio between the first area of the first electrode and the second area of the second electrode is greater than 1.

14. The display device of claim 10, wherein the electrostatic guide hole is spaced apart from the second electrode and does not overlap with the second electrode from a plan view.

15. The display device of claim 10, comprising:

a cap covering the light emitting diode, wherein the cap does not overlap with the electrostatic guide hole.

16. The display device of claim 15, wherein the electrostatic guide hole is disposed along a periphery of the cap.

17. The display device of claim 16, wherein the electrostatic guide hole has a C-shape from a plan view.

18. A display device, comprising:

a light emitting diode on a substrate;

a first electrode and a second electrode spaced apart from each other on the substrate;

a protective layer on the first electrode and the second electrode;

an electrostatic guide hole adjacent to the light emitting diode, the electrostatic guide hole extending through the protective layer, wherein the light emitting diode is on the protective layer and overlaps with the first electrode and the second electrode;

wherein the first electrode includes a plurality of first electrode patterns that is spaced apart from each other, wherein the second electrode includes a plurality of second electrode patterns that is spaced apart from each other, wherein the plurality of first electrode patterns electrically connected to the light emitting diode collectively has a first area and the plurality of second electrode electrically connected to the light emitting diode collectively has a second area, wherein an area ratio between the first area of the plurality of first electrode patterns and the second area of the plurality of second electrode patterns is greater than 1.

* * * * *